United States Patent [19]

Suzuki et al.

[11] Patent Number: 5,258,626
[45] Date of Patent: Nov. 2, 1993

[54] SUPERCONDUCTING OPTICALLY RECONFIGURABLE ELECTRICAL DEVICE

[75] Inventors: Andrew H. Suzuki, Kihei, Hi.; Joseph E. Brandelik, New Carlisle, Ohio

[73] Assignee: The United States of America as represented by the Secretary of the Air Force, Washington, D.C.

[21] Appl. No.: 902,256

[22] Filed: Jun. 22, 1992

[51] Int. Cl.[5] .................... H01L 39/22; H01B 12/00; H01P 1/00
[52] U.S. Cl. .................................. 257/39; 257/662; 257/663; 505/1; 505/701; 505/866
[58] Field of Search ............. 505/1, 701, 866; 257/39, 662, 663

[56] References Cited

U.S. PATENT DOCUMENTS

| | | | |
|---|---|---|---|
| 4,586,062 | 4/1986 | Bouffard et al. | 357/5 |
| 4,891,355 | 1/1990 | Hayashi et al. | 505/1 |
| 4,904,882 | 2/1990 | Szu | 307/245 |
| 4,916,115 | 4/1990 | Mantese et al. | 505/1 |

OTHER PUBLICATIONS

Koch et al., "Quantum Interference Devices Made From Superconducting Oxide Thin Films", Appl. Phys. Lett. vol. 51, #3, Jul. 20, 1987, pp. 200–202.
Gershenzon et al., "Fast Superconducting Electron Bolometer", Sov. Tech. Phys., vol 15, #2 Feb. 1989, pp. 118–119.
Forrester et al., "Optical Response of Epitaxial Films of Y-Ba-Cu-O", Appl. Phys. Lett., vol. 53 (14), Oct. 3, 1988, pp. 1332–1334.
Demetri Psaltis et al, Title, Optical Image Correlation with a Binary Spatial Light Modulator, vol. 23 No. 6, Nov.–Dec. 1984, pp. 698–704 (Optical Engineering).
W. E. Ross et al, Title, Optical Engineering, Two-Dimensional Magneto-Optic Spatial Light Modulator for Signal Processing, vol. 22, No. 4, pp. 485–490, Jul.–Aug. 1983.
W. E. Ross et al, Title Spie, Advances in Optical Information Processing, vol. 388, 1983, pp. 55–64 Semetex Corp. Sight-Mod.
G. T. Roome, et al, Title IEEE Transactions on Microwave Theory and Techniques, Section II, MIC Components, Jul. 1968, pp. 411–420.
G. T. Roome et al, Title Journal of Applied Physics, Thin Ferrite Phase Shifters for Integrated Microwave Devices, vol. 38, No. 3, Mar. 1967, Section II pp. 1411–1412.
C. E. Fay & R. L. Comstock, Title IEEE Transactions, Operation of the Ferrite Junction Circulator, Section II Microwave Integrated Circuits pp. 1–13.
C. K. Greene, Title IEEE Transaction on Microwave Theory and Techniques, A Microstrip Nonreciprocal Tunable Yig Filter, Section II, Jul. 1968, pp. 485–486.

Primary Examiner—Rolf Hille
Assistant Examiner—Mahshid Saadat
Attorney, Agent, or Firm—Gerald B. Hollins; Donald J. Singer

[57] ABSTRACT

A superconducting network which, through the use of optical illumination, can form a selectable array of superconducting microstrip transmission lines or other electrical elements. The invention uses optical illumination to produce quasiparticles which cause selected physical parts of the network to be electrically nonconductive and thereby define the nonilluminated conductor's shape, physical size, and electrical characteristics. Network reconfigurability to produce several different devices and functions from a single high or low temperature superconductive chip is a disclosed utilization of the invention. The employed optical illumination produces phase change within the superconducting material to provide specific chip architectures. Reconfiguring of the device characteristics is achieved by changing the optical input intensity, spatial orientation, wavelength or combinations of these factors. A plurality of delay line configurations are disclosed as examples.

15 Claims, 6 Drawing Sheets

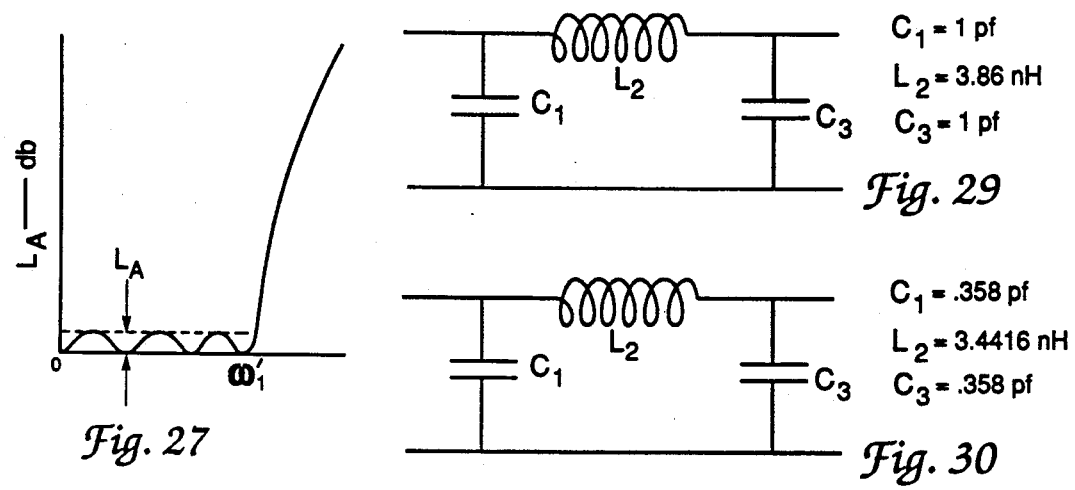
Fig. 27
Fig. 29
Fig. 30
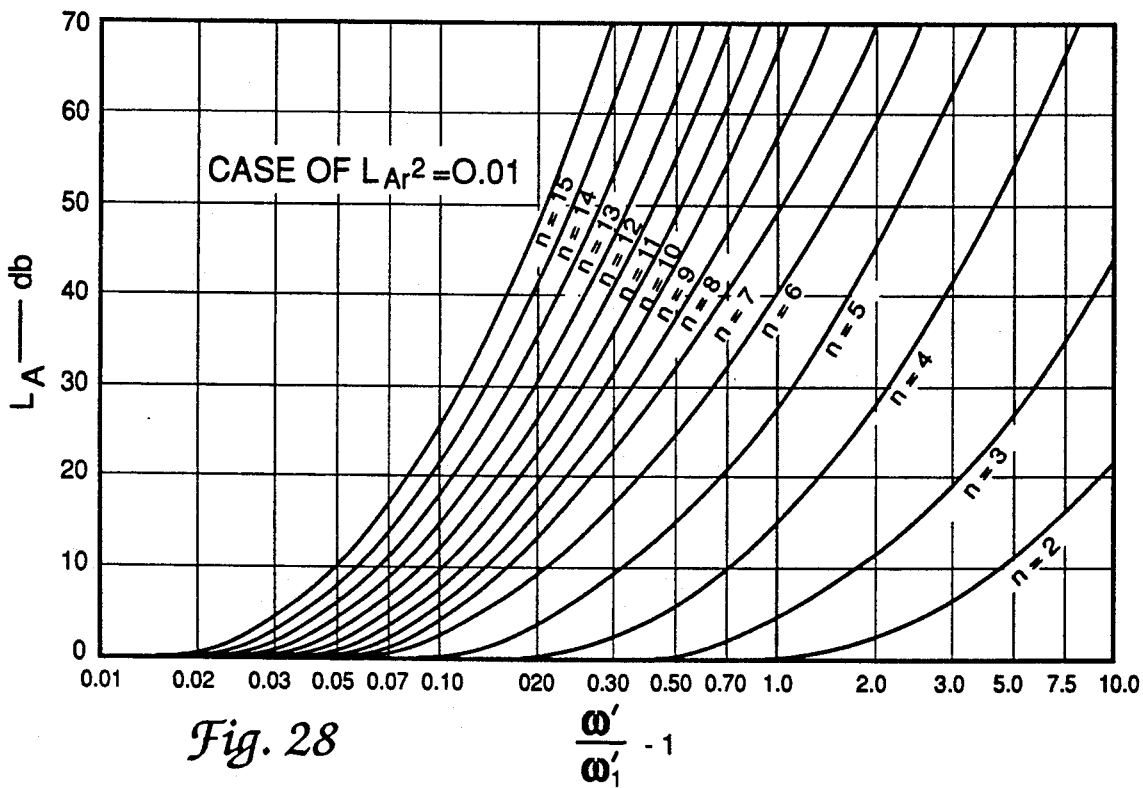
Fig. 28
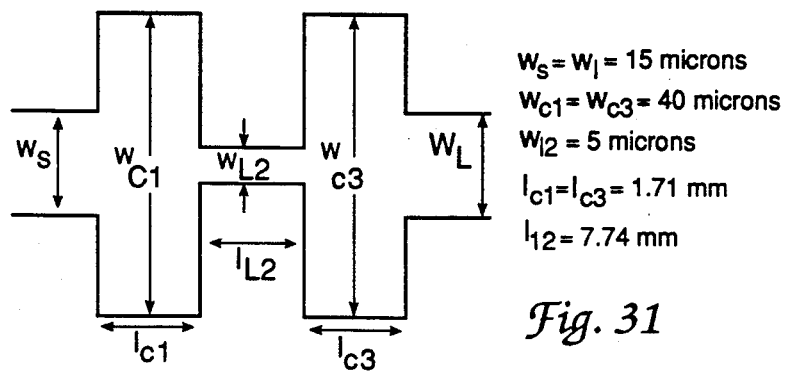
Fig. 31

SUPERCONDUCTING OPTICALLY RECONFIGURABLE ELECTRICAL DEVICE

RIGHTS OF THE GOVERNMENT

The invention described herein may be manufactured and used by or for the Government of the United States for all governmental purposes without the payment of any royalty.

CROSS REFERENCE TO RELATED APPLICATION

The present patent document is somewhat related to the concurrently filed and commonly owned patent document "Superconducting Optically Reconfigurable Magnetic Device" Ser. No. 07/902,257 which originates with the same inventors and is hereby incorporated by reference herein.

BACKGROUND OF THE INVENTION

The invention relates to the field of superconducting materials and to thin film geometries of these materials which are alterable through use of controlling optical energy.

The superconducting optically reconfigurable device (SORD), of the present invention, integrates physical processes underlying the electrical superconductivity phenomenon with the field of optics. The SORD uses the ability of a superconductor to transition from the superconductive to a less conductive normal state as its defining mechanism. This transition from the superconducting state to the normal state is dependent upon the breaking up of so-called Cooper pair electrons; one means of accomplishing this breaking up is by the injection of what are termed quasiparticles. Quasiparticle injection can in fact be accomplished by various means, however, for present purposes the means of most interest is by optical illumination. For these purposes, similar behavior between high and low temperature superconductors is presumed.

The patent art indicates the presence of considerable activity in the superconducting and other SORD related arts. Included in this activity is the patent of J. H. Boufford et al, U.S. 4,586,062, which teaches the achievement of microcircuits formed of superconducting material, material which when exposed to cryogenic temperatures, provides superconducting regions.

Additionally included in the art is the patent to N. Hayashi et al, U.S. Pat. No. 4,891,355, describing a method of producing a superconducting device by applying a laser beam to a part of the superconducting phase to cause transition from a superconducting to a non-superconducting phase.

Also included is the patent to H. H. SZU, U.S. Pat. No. 4,904,882, describing a superconducting optical switch which is controlled by radiation from a spatial light modulator.

Additionally included in this art is the patent to J. V. Mantese et al, U.S. Pat. No. 4,916,115, teaching the formation of a superconductive device of metallo-organic film which absorbs selective laser light wavelengths.

None of these prior patents, however, teaches the achievement of a reconfigurable superconductive device as is accomplished in the present invention.

SUMMARY OF THE INVENTION

The present Superconducting Optically Reconfigurable Device (SORD) comprises an electrical circuit that may be realized, for example, as an array of superconducting transmission lines. The SORD concept is based on quasiparticle injection into superconducting thin films to produce a detectable physical properties response. Quasiparticle injection can be accomplished via different means, including the herein preferred selective optical illumination. The present SORD utilizes this optical illumination to produce a phase change and a resulting electrical impedance variation within, for example, superconducting transmission line elements in order to define device electrical architectures.

Since the SORD uses optical illumination, the device response can be reconfigured by altering one or more characteristics of the input illumination. This alteration of device response can in fact be accomplished by changing the illumination's intensity, spatial orientation, wavelength, or combinations of these factors. The present SORD can also be realized by using either high or low temperature superconducting materials. A restriction placed on the SORD device is, however, that the host film thickness be less than the film material's absorption depth. The SORD lends to circuit applications in the areas of detector array processing, wideband communications, pulse compression radar, and signal spectrum analysis, for example.

It is therefore an object of the present invention to achieve an optically configurable thin film structure.

It is another object of the invention to achieve an optically configurable superconducting device.

It is another object of the invention to achieve an optically configurable filter network which employs superconductive elements.

It is another object of the invention to achieve a universal filter array which can be optically configured into a plurality of specific filter characteristics.

It is another object of the invention to provide a superconducting device in which quasiparticles generated by optical energy define the architecture of the device.

It is another object of the invention to provide a superconducting device which is compatible with both low and high temperature superconducting materials.

It is another object of the invention to provide an electrical device in which illumination intensity, spatial orientation, illumination wavelength or combinations of these optical factors may be used to control the device characteristics.

Additional objects and features of the invention will be understood from the following description and claims and the accompanying drawings.

These and other objects of the invention are achieved by a transmission line apparatus comprising the combination of:

a planar disposed layer of superconductive material extending between transmission line electrical input and electrical output nodes disposed thereon;

means for maintaining selected contiguous pattern portions of said planar layer material located intermediate said input and output nodes within the superconductive range of operating temperature thereof;

optical energy source means for reversibly elevating predetermined pattern additional portions of said superconductive material above said superconductive range of operating temperature and generating an operating region of lessened electrical conductivity;

said selected contiguous pattern material portions comprising a conductive electrical path of predetermined transmission line electrical characteristics between said electrical input and electrical output nodes; and said predetermined pattern elevated temperature additional portions of said material comprising electrical insulation disposed adjacent said selected contiguous pattern material portions.

BRIEF DESCRIPTION OF THE DRAWINGS

FIG. 27 shows a 0.01 db ripple Tschebycheff low pass filter characteristic.

FIG. 28 shows a 0.01 db ripple second Tschebycheff low pass filter characteristic curve family.

FIG. 29 shows a 2 Gigahertz cutoff Tschebycheff low pass filter circuit arrangement.

FIG. 30 shows a 2 Gigahertz cutoff Tschebycheff low pass filter in modified circuit arrangement.

FIG. 31 shows the FIG. 30 filter with transmission line dimensions.

DETAILED DESCRIPTION

Two physical states of existence for a conductive or semiconductive material are generally recognized, the warm temperature or normal state and the superconducting state which usually involves colder temperatures. One useful characteristic of the superconducting state is the great decrease in electrical resistance which occurs during superconductivity. An interesting characteristic of the superconducting state is called by the name of the Meissner effect and is typified by an exclusion of magnetic fields from the interior of a superconductor material mass. Each of such changes in physical properties can be employed in useful SORD arrangements as is explained below herein and in the above-identified commonly filed companion patent application. In actuality, the present one of these two applications is principally concerned with the former electrically responsive SORD and with delay line related uses thereof while the companion application is principally concerned with the Meissner effect related properties of a SORD.

Figure 1:
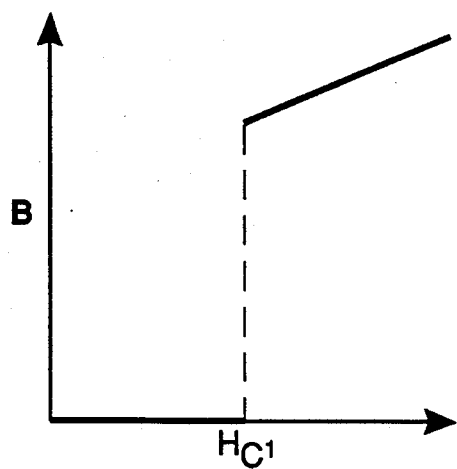
FIG. 1 shows the relationship between magnetic field strength and flux density for a type I superconductor.
Figure 2:
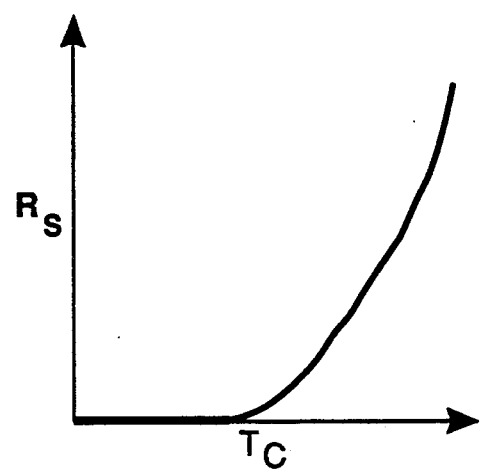
FIG. 2 shows the relationship between temperature and electrical resistance for a type I superconductor.

In addition to the electrical properties and Meissner effect or magnetic properties related uses of superconductivity, there are two varieties of superconductors which are of concern in the present invention; these are the so-termed Type I and Type II varieties. Phase transition characteristics between normal and superconducting states define the difference between these two varieties of materials as is shown in FIGS. 1-4 of the drawings. These figures present graphical representations of the magnetic or B-H and the electrical resistance temperature response characteristics of the two types of superconductors; FIGS. 1 and 2 represent Type I superconductors and FIGS. 3 and 4 Type II. In addition to the following discussion of the Type I and Type II superconducting materials, an interesting introductory description of superconductivity and the Type I and Type II materials is to be found in an article titled "Superconductivity", written by D. N. Langenberg and appearing in the McGraw-Hill Encyclopedia of Science and Technology, Volume 17 of the 1987 copyright version, page 609. The Langenberg article and the references identified therein are hereby incorporated by reference herein.

Figure 3:
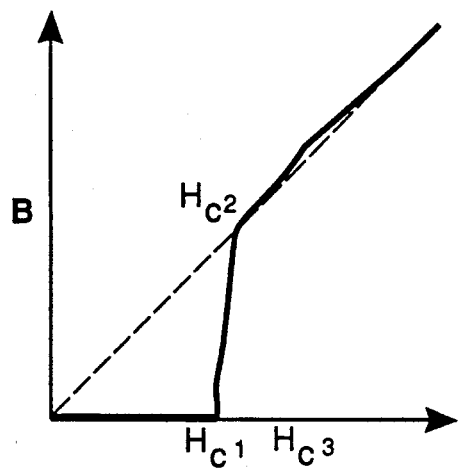
FIG. 3 shows the relationship between magnetic field strength and flux density for a type II superconductor.
Figure 4:
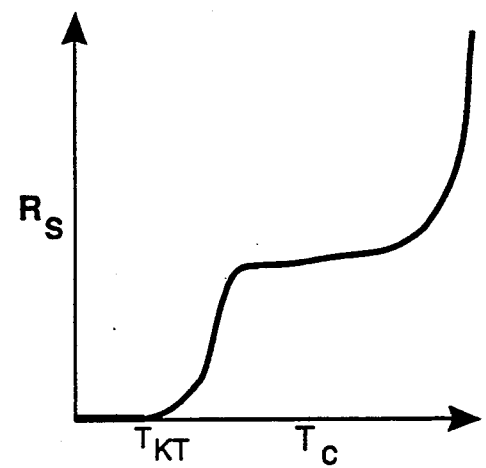
FIG. 4 shows the relationship between temperature and electrical resistance for a type II superconductor.

The driving mechanism behind the FIGS. 1-4 phase transitions are magnetic field strength in FIGS. 1 and 3 and ambient temperature in FIGS. 2 and 4. The major difference between the two types of superconductors lies in their normal to superconducting phase transitions. As a Type I superconductor transitions from the normal to the superconducting state, any magnetic field entering the material will be locked in during the phase transition. A similar, but distinguishable, effect occurs for the Type II superconductor, where the material is characterized by the occurrence of only a partial flux penetration into the body of a material mass. The Type II superconductor therefore makes an interim phase transition to a partial "Meissner" condition prior to phase transitioning into either the normal or the superconducting state. The Meissner effect has been defined as the expulsion of magnetic flux from the interior of a superconducting material when it is cooled in a magnetic field to below the critical temperature, near absolute zero, at which the transition to superconductivity takes place. See the article titled "Meissner effect" written by Hans W. Meissner and describing the 1933 work of Walter Meissner and R. Ochsenfeld appearing in the McGraw Hill Encyclopedia of Science and Technology, at Volume 10 page 578, which is also hereby incorporated by reference herein.

In "Hard" Type II superconductors the extent of the Meissner effect transition region is minimized by the use of flux pinning mechanisms which tend to situate the flux vortices and reduce the kinetic generation of electrical resistance. It is these phase transitions and the physical mechanisms behind them that the herein described SORD utilizes for its operation.

Thin film superconductors in addition undergo several different processes when illuminated with light. Two of these processes are frequently identified as the slow and fast responses of the material. These slow and fast responses represent phase transitions from the superconducting to the normal state. Thin films are subjected to these types of responses because interactions only occur within the absorption depth of the thin film. The absorption depth is the inverse of the absorptivity and is actually determined by the material, the fabrication process, and the light wavelength involved. For Yttrium Barium Copper Oxides (YBCO), the absorption has been quantized to be on the order of 120 nm[1]. (The reference number 1 here relates to the similarly numbered item in the list of references appearing at the conclusion of this specification.) For niobium and niobium nitride, the absorption depths are approximately 300 and 500 angstroms, respectively.

If the superconductor material film thickness being considered in an electrical resistance superconductor application is larger than the absorption depth, a diffusive response produces a simple redirection of current which essentially shorts out or attenuates the quasiparticle injection process. The diffusive process is defined in equation 1 below and is a process which occurs in the order of femtoseconds of time. For thick films, where the film thickness is larger than the absorption depth, the diffusive process negates the generation of quasiparticles and the phase transitioning response is not observed.

$$D_{em} = p/\mu_o \quad (1)$$

Where p=normal resistivity of the material, and $\mu_o$ is the Permeability of free space.

The quantization of these responses has been disclosed recently. In this regard, it was once thought that there was a single response with a very fast nanosecond rise time together with a much slower decay time—a time measurable in microseconds. Recent work has however led to the hypothesis that there are two distinct response processes occurring. The distinction between these responses is found by looking at the temporal response characteristics and the temperature regimes.

The fast response has been quantized to be a nanosecond or possibly picosecond characterized response, whereas the slow response is in the microsecond regime. The slow response is predominant near the critical temperature (Tc) of the material and there is no evidence of the slow response occurring at temperatures well below the Tc value. The fast response is evident at temperatures well below Tc as well as at temperatures near Tc. There also appears to be saturation of the maximum fast response well below the Tc temperature with saturation disappearing in the region of the slow response. There is also evidence of a slight overlap of these two responses, a fact which may have led to confusion between the nature of the responses. The relative peak of the fast response is thought to be at zero degrees Kelvin whereas the maximum of the slow response occurs at Tc.

The mechanism behind the fast response has not been well defined, but the response is believed to be a nonequilibrium rather than a bolometric (thermal heating based) process. It has also been suggested that the response is based on the hot-electron transport phenomenon previously demonstrated in optically excited metals such as copper and gold. It is also hypothesized that incident radiation creates a large number of highly excited electrons and holes in the top 100 nanometers or so of the superconductive film. These so-called hot electrons move through the film either by ballistic or diffusive means after creation. In turn, the hot electrons thermalize with the lattice structure of the material via electron-photon interactions to create the quasiparticles. The observed relaxation time is on the order of picoseconds. The fast response has also been quantized to have a temporal response function which is on the order of tens of nanoseconds. It is quite possible that the actual temporal response of the fast response could be markedly faster, since the speed of measuring equipment and the excitation media may be measurement limiting factors.

The slow response has been extensively studied and is thought to be a predominantly thermal based mechanism. Thermal diffusion and local heating due to incident illumination have been theorized to be the main drivers behind the slow response. The region where the slow response is most dominant is very close to the Tc of the materials. The effect of incident illumination on the electrical resistivity of the material appears to be not as strong as on the fast response. There is also evidence supporting speculation that the fast response brings about a much larger change in electrical resistivity than does the slow response. In any event the change in electrical resistivity with the incidence of optical energy is found to be a property that is useful in optically reconfiguring an electrical network.

A superconducting bridge composed of Yttrium Barium Copper Oxide (YBCO) on a Magnesium Oxide (MgO) substrate can be used to characterize fast and slow response temporal characteristics. The fast and slow responses have been experimentally verified to have a temporal responses in the nanosecond and microsecond regimes respectively.

Figure 5:
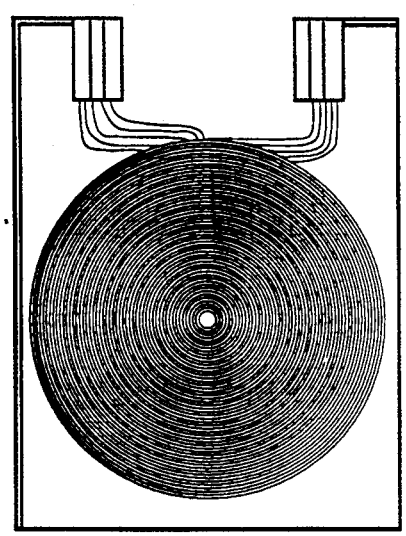
FIG. 5 shows a spiral delay line use of the invention.
Figure 6:
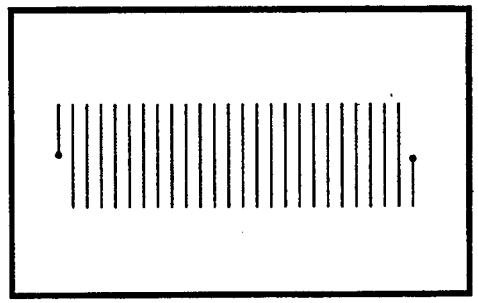
FIG. 6 shows a meander delay line use of the invention.

The present Superconducting Optically Reconfigurable Device (SORD), in one arrangement thereof is comprised of an array of superconductive microstrip transmission lines which utilize the above described fast or slow response mechanisms to achieve a phase change and impedance change in selected physical portions of the line elements and the material adjacent the line elements. The SORD architecture may be in the form of a spiral delay line structure as shown in FIG. 5 or a meander delay line structure as shown in FIG. 6. Other multi-line structures may also be used. The structure depicted in FIG. 6 has a single meander line, the SORD, however, is contemplated to include multiple lines.

The present SORD concept is applicable to either low or high temperature superconductive material. If the SORD is fabricated using a high temperature superconductor, then by operating near Tc the cooling requirements are reduced until liquid nitrogen can be used in lieu of liquid helium. Liquid nitrogen affords a drastic reduction in system cost coupled with an increase in system safety. Superconductor transition temperature ranges have been found to be in the 70°-120° K. range for high temperature materials and in the 1°-15° K. range for low temperature niobium based materials. These ranges are highly dependent upon fabrication processes as they intimately depend upon carrier density values.

Although films of this type have been manufactured, the Process required is intricate since the process must also control the granularity of the film and its orientation in order to increase the achievable film current density. By having a consistent grain structure and orientation, it is possible to increase the magnitude of the fast and slow response. By using a highly oriented consistent grain structure, the transition region from superconducting to normal may also be reduced; this ultimately means a much quicker device response.

The SORD concept is also extendable to utilize the fast response—a concept which markedly reduces the system reconfiguration time achievable. By using the slow response the system response time may in fact be limited by the substrate material's thermal diffusion characteristics. By using the fast response, the system reconfiguration time also tends to be limited by the time required for reconfiguration of the optics. With the development of better quality higher critical temperature superconductors, it is expected that the fast response will be extended to the temperature region where liquid nitrogen cooling can be used.

A superconducting thin film exhibits a thermal transition due to incident illumination which can be characterized using a heat transfer model as is shown in Eq. 2.

$$T = 1.18 F (\tau/(Kcp))^{3/2} \quad (2)$$

Where the variables are defined as:
T = Change in temperature
$\tau$ = Duration of optical pulse
F = Rate of heat supplied
K = Substrate thermal conductivity
c = Substrate specific heat
p = Substrate density A YBCO superconductor thin film of 400 angstroms thickness and disposition on a MgO substrate will undergo a temperature change of 0.15 to 0.5 degree K. with incident illumination. This value correlates well with a predicted value of 0.2 degree K. using the equation (2) model. These results use illumination from a 1.06 μm Nd-YAG laser having a short Gaussian shaped 200 ns q-switched laser pulse and an energy of 16 nJ. The superconducting device bias currents may be varied between 1 and 5 mA with measurements occurring between temperatures of 35 and 90 degrees K. A 150 ps pulse with an energy of 150 nJ on a similar superconductor device at 38 degrees K. with a bias current of 0.5 mA. provides a rise in film temperature of 1.7 degrees K.

It is the underlying concept of the SORD to utilize such changes in film temperature to transition the illuminated region of the device from the superconductive to the resistive operating region. By selectively masking and illuminating parts of the superconducting transmission line (or other embodied electrical network), a variety of characteristics may be realized. According to this operation the uncoated or unmasked regions of the device will be free to absorb the incident illumination and undergo a rise in operating temperature—a rise ending with temperatures outside of the superconducting range, and thereby effectively "turn off" portions of the microstrip.

When the SORD is operating in the temperature regime near Tc, the reconfiguration time limit is thought to reside in the substrate's thermal diffusion time. The substrate material can, however, be chosen to reduce reconfiguration time without adversely affecting the device performance. Tradeoff considerations involving microwave or RF response characteristics and thermal, chemical, and lattice matching effects of the substrate are to be considered in the choice of substrate and superconducting materials.

The presently described embodiment of the invention involves a microstrip architecture, however, alternate architectures such as striplines, or coplanar transmission line arrangements may be used to reduce this overall device size and optimize the parameters of an embodied transmission line. The microstrip line device operates as a "quasi-Transverse Electromagnetic Mode (quasi-TEM)" device due to the different dielectric materials surrounding the conducting region (e.g. air and dielectric). Since the operation is quasi-TEM, the static TEM parameter methodology is used to define the line parameters. These static parameters are accurate when the frequencies considered do not exceed tens of gigahertz. When the frequencies considered exceed this range, a transition of the analysis is desirable—to determine the essential parameters utilizing a "closed form" type of analysis. Such closed form analysis includes dispersive effects and defines the frequency dependence of parameters such as characteristic impedance. The closed form analysis also defines cutoff frequencies and loss mechanisms. For the disclosed device however, a baseline device is described by using the static-TEM method. The regime of the closed-form techniques may nevertheless be used by persons skilled in the art in view of the present disclosure.

Figure 7:
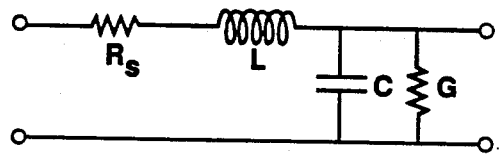
FIG. 7 shows a distributed element transmission line section.

A basic thin film transmission line can be modeled using the typical transmission line distributed element approach as shown in FIG. 7. Elemental parameters are defined per unit in the thin film superconductor as follows:

$$R_s = (\omega^2 \mu \lambda^{3/2}) (Tc/T) e^{-(\Delta(T)/k_bT)} \quad (3)$$

$$\Delta(T) \approx 3.2 k_b T_c (1 - T/T_c)^{\frac{1}{2}} \quad (3a)$$

$$L = (h\mu/KW)(1 + \lambda_1/h') \coth (t_1/\lambda_1) + (\lambda_2/h) \coth (t_2/\lambda_2) \quad (4)$$

$$\lambda_L(T) = \lambda_L(0)[1 - (T/T_C)^4]^{-\frac{1}{2}} \quad (4a)$$

$$C = \epsilon K W/d \quad (5)$$

$$\epsilon = \epsilon_o \epsilon hd \text{ eff} \quad (5a)$$

$$G = \sigma W/d \quad (6)$$

Where the variables are defined as follows:

| VARIABLE | DEFINITION |
|---|---|
| $\omega$ | Angular frequency (radians/second) |
| $\mu$ | Permeability (H/m) |
| $\epsilon$ | Permittivity (F/m) |
| $\lambda$ | Penetration depth (m) |
| T | Ambient temperature (°K.) |
| K | Geometric Factor |
| $k_b$ | Boltzman's constant (J/K) |
| $\sigma$ | Electrical conductivity (1/ohm-$\chi$m) |
| h = separation of superconductors | |
| $t_i$ = thickness of superconductors | |
| w = width of stripline | |

The permittivity, $\epsilon$, is the product of the relative permittivity $\epsilon_r$ and the permittivity of free space $\epsilon_o$. The permittivity of free space is defined to be $8.854 \times 10^{-12}$ F/M.

For thin films $t_i < \lambda_i$ so coth $(t_i/\lambda_i) \approx \lambda_i/t_i$ and $L = h\mu/KW (1+\lambda_1^2/ht_1+\lambda_2^2/ht_1)$ For thick films $t_i \approx \lambda_i$ and coth $(t_i/\lambda_i) \approx 1$ and $L = h\mu/KW (1+\lambda_1/h+\lambda_2/h)$ The effective dielectric constant $\epsilon_{eff}$ is substituted for the dielectric constant $\epsilon_r$. Therefore whenever permittivity is referred to, it is assumed to be a function of the effective dielectric constant. The effective dielectric constant is bounded by the value of an aspect ratio defined as the ratio of film width (W) to dielectric thickness (h). The definition of the dielectric constant is therefore:

$$\text{For } W >> h; \epsilon_{eff} = \epsilon_r \quad (7)$$

$$\text{For } W << h; \epsilon_{eff} = \tfrac{1}{2}(\epsilon_r+1) \quad (8)$$

Figure 8:
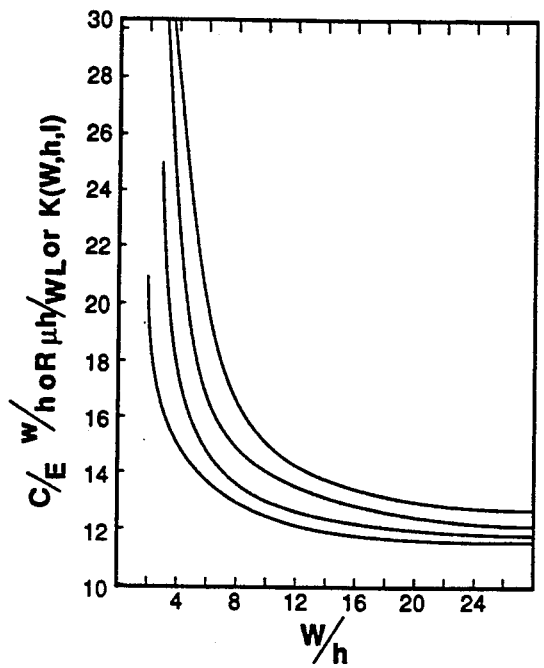
FIG. 8 shows the relationship between microstrip aspect ratio and the fringing field effect K parameter.

The K parameter is also a geometrically based value that is used to compensate for fringing field effects encountered in stripline devices. The K parameter is based on the aspect ratio (W/h) as well as a thin film thickness ratio (t/h). The K parameter of FIG. 8 is a material—independent entity with direct relationship to the superconductor's impedance and capacitance as described in equations (4) and (5). As the aspect ratio decreases and film thickness increases, the fringing field effect becomes more significant as shown in FIG. 8.

The distributed system parameters are derived from the basic 2-fluid London model for superconductors except for definition of the surface resistivity, which is derived from the standard Bardeen Cooper and Schrieffer analysis. The surface resistivity should also take into account a residual resistivity factor (Rres). This residual resistivity factor is believed to be material/fabrication process dependent upon density of impurities and trapped flux. This factor is incorporated as an additive or bias factor to Eq. 3. When this residual resistivity factor is incorporated into the Rs calculation, the theoretical results conform well to empirical data.

Once the distributed line parameters have been defined, analysis of the microstrip line structure can follow traditional transmission line practice. The characteristic impedance ($Z_0$) and propagation constant ($\gamma$) are defined by $$Z_0 = ((R+j\omega L)/(G+j\omega C))^{\frac{1}{2}} \quad (9)$$

$$\gamma = ((R+j\omega L)*(G+j\omega C))^{\frac{1}{2}} \quad (10)$$

If it is assumed that operation in the superconducting region is accompanied low line loss (i.e. Rs and G are very small) then the characteristic impedance ($Z_0$) and phase constant ($\beta$) are defined as;

$$Z_0 = (L/C)^{\frac{1}{2}} \quad (11)$$

$$\beta = \omega (LC)^{\frac{1}{2}} \quad (12)$$

It should be noted that these parameters are independent of frequency. At higher frequencies the closed formula analysis is utilized to account for frequency dependence of the transmission line parameters. For application to thick films the distributed inductance parameter changes markedly. The phase and group velocities are defined as;

$$v_p = \omega/\beta = 1/(LC)^{\frac{1}{2}} \quad (13)$$

$$v_g = d\omega/d\beta \quad (14)$$

where the group velocity is the differential operation.

The total time delay achieved is determined by the ratio of the line length and group velocity. The time delay $t_d$ can also be approximated as the ratio of the line length and the phase velocity as follows:

$$t_d = \text{line length}/v_p. \quad (15)$$

Figure 9:
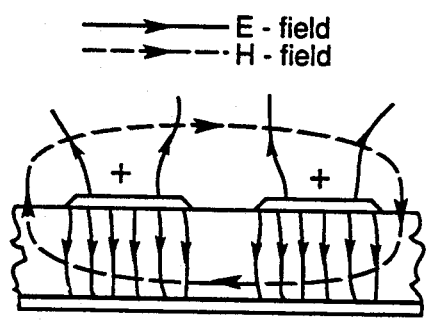
FIG. 9 shows even mode E and H field coupling between transmission line elements.
Figure 10:
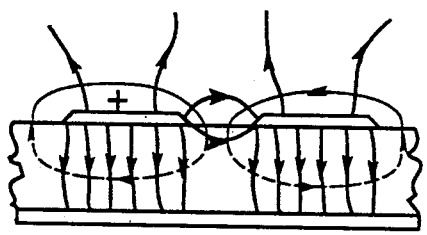
FIG. 10 shows odd mode E and H field coupling between transmission line elements.
Figure 11:
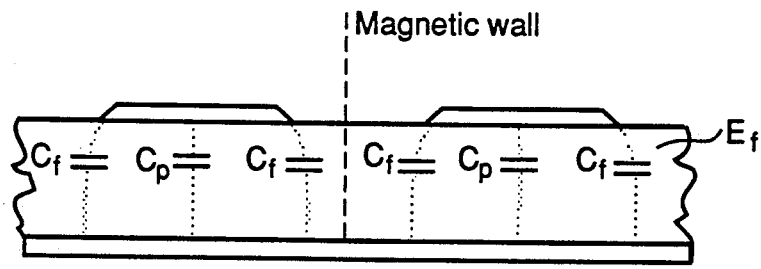
FIG. 11 shows even mode capacitance coupling between transmission line elements.
Figure 12:
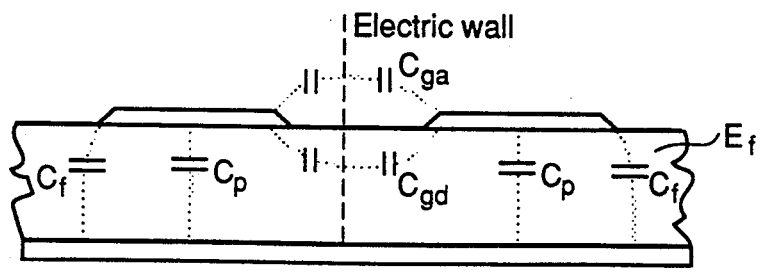
FIG. 12 shows odd mode capacitance coupling between transmission line elements.

When coupled lines are used to define the device parameters, it is desirable to understand the coupling mechanisms and field structures associated with these lines. Such field structure is characterized by even and odd mode fields as are shown in FIGS. 9 and 10 of the drawings. The coupling mechanism is of the typical capacitive type and the capacitances involved differ, depending on whether an even or odd mode field structure prevails as is shown in FIGS. 11 and 12, respectively.

Field definitions are as defined in equations 16 and 17:

$$C_e = C_p + C_c + C_f \quad (16)$$

$$C_o = C_p + C_f + C_{ga} + C_{gd} \quad (17)$$

Both the even and odd mode fields have associated parallel plate ($C_p$) and fringing field ($C_f$) capacitances associated with them as are described in equations 18 and 19.

$$C_p = \epsilon_o \epsilon w/h \quad (18)$$

$$2C_f = ((E_{eff})^{\frac{1}{2}}/cZ_o) - C_p) \quad (19)$$

The even mode capacitance have the additional effect of fringing field very close to the magnetic wall ($C_f'$).

$$C_f' = (C_f/(1+A(h/s)tanh(8s/h))) (\epsilon_r/\epsilon_{eff})^{\frac{1}{2}} \quad (20)$$

$$A = e - [0.1e^{(2.33-2.53w/h)}]$$

The odd mode capacitance in addition to Cp and Cf have gap associated capacitance defined as $$C_{gd} = [\epsilon_o \epsilon_r/\pi][ln (coth(\pi s/4h))] + 0.65C_f((0.02h/s)\sqrt{\epsilon_r}) + 1 - (\epsilon_r)^{-2}] \quad (21)$$

$$C_{gs} = (\epsilon_0) [K(k')/K(k)] \quad (22)$$

$$k = (s/h)/[(s/h)+(2w/h)] \quad (22a)$$

$$k' = (1-k^2)^{\frac{1}{2}} \quad (22b)$$

$$[K(k')/K(k)] = (1/\pi)[\ln(2(1+(k')^{\frac{1}{2}})/(1-(k')^{\frac{1}{2}}))] \text{ For } 0 \leq k^2 \leq 0.5 \tag{22c}$$

$$[K(k')/K(k)] = \pi/[\ln(2(1+(k)^{\frac{1}{2}})/(1-(k)^{\frac{1}{2}}))] \tag{22d}$$

Where Cgd and Cga are the capacitances across the dielectric and air gap respectively.

Once the individual even and odd mode capacitances have been defined, the even $Z_{oe}$ and odd $Z_{oo}$ mode characteristic impedances may be determined from Eqs 23 and 24 and a coupling factor calculated as in Eq. 25 where c is the speed of light.

$$Z_{oo} = 1/cC_{1o}(E_{effo})^{\frac{1}{2}} \tag{23}$$

$$Z_{oe} = 1/cC_{1e}(E_{effe})^{\frac{1}{2}} \tag{24}$$

$$C = (Z_{oe} - Z_{oo})/(Z_{oe} + Z_{oo}) \tag{25}$$

Figure 13:
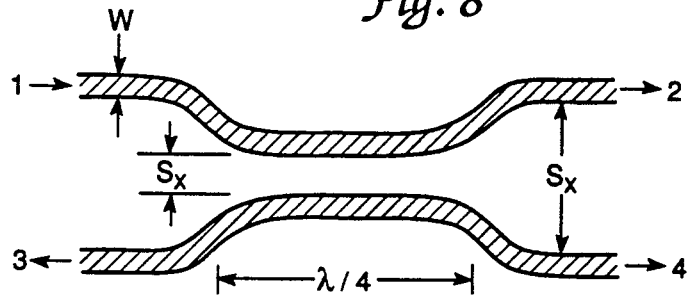
FIG. 13 shows a typical backward wave transmission line coupling arrangement.

The typical backward wave coupling structure is shown in FIG. 13 of the drawings.

The terminal voltages are defined as follows:

$$V_1 = 1 \text{ (just the input voltage as defined)} \tag{26}$$

$$V_2 = (1 - C^2)^{\frac{1}{2}}/(1 - C^2 \cos\theta + j\sin\theta)^{\frac{1}{2}} \tag{27}$$

$$V_3 = (j\sin\theta)/(1 - C^2 \cos\theta + j\sin\theta)^{\frac{1}{2}} \tag{28}$$

$$V_4 = 0 \tag{29}$$

The forward coupled voltage is assumed to be negligible, however in practice there may be slight voltage transfer in the forward direction. The backward coupled voltage at terminal 3 is used to define the length $l_g$ at which the maximum signal is coupled. This length is defined in equation 30 and is seen to be wavelength sensitive. This is used in the bandpass and chirp filter embodiments disclosed below.

$$l_g = \lambda_g/4 \ (2n-1) \text{ for } n = 1,2,3 \ldots \tag{30}$$

Figure 14:
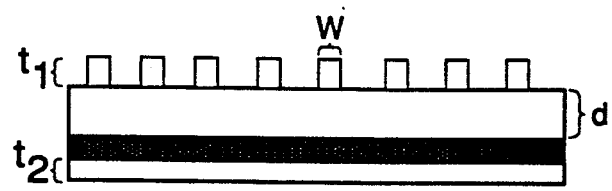
FIG. 14 shows one typical superconductor arrangement of the invention.

Since the SORD can be implemented using either a low or high temperature superconductor material, different device architectures and ancillary materials are employed between these different superconductor materials. The baseline or nominal structure is shown in FIG. 14 and is applicable to low temperature superconductors; this structure, however, may not yet be achievable in high temperature superconductors using presently available fabrication techniques. The description following is based on the FIG. 14 structure, however, an alternate presently achievable architecture is shown in FIG. 15 for use with high temperature superconductor materials.

Figure 15:
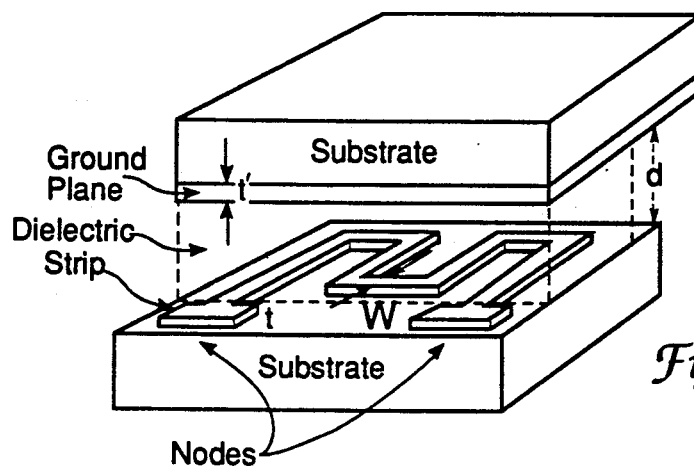
FIG. 15 shows another typical superconductor arrangement of the invention.

The FIG. 15 architecture has been demonstrated to locate the penetration depth in a variety of thin film superconductors. There will be a difference in the field structure with respect to the FIG. 14 quasi-TEM structure if the alternate architecture of FIG. 15 is used. A quasi-TEM field structure is assumed herein as an approximation to aid in the development of the baseline device. These are, however, not the only achievable SORD architectures, since as fabrication processes evolve, different architectures are possible. The SORD concept of optical architecture definition is adaptable to many different superconductive thin film orientations.

Once the device's distributed transmission line parameters have been determined, both the achieved operating characteristics and the realization process may follow microwave stripline circuit techniques.

The masking technique to define device architecture can have many variations since a holographic mask, a shadow mask, or a contact mask can, for example, be used. By using a highly reflective mask, the devices' active regions are defined when illuminated with incident radiation. It is also contemplated to use a wavelength selective masking scheme wherein different wavelengths of incident light reconfigure the achieved SORD device. According to a further refinement of the SORD, the patterning of the microstrip lines may be accomplished by a masking arrangement which defines the "active"/superconducting regions. It should be noted that variation of the stripline parameters is also achievable without actually initiating a full phase transition in the superconductive material, that is by raising the material portions which are to be nonconductive only modestly above the superconductive range.

Several types of electrical devices can be realized utilizing the described superconducting delay line as the basic underlying vehicle. These devices include low-pass filters, high pass filters, notch filters, bandpass filters, chirp filters, and delay lines. The described SORD realization can also be used when implementing convolution, correlation, and logic function networks using a superconductive delay line as the underlying circuit element.

A superconducting delay line employs the principle that group velocity multiplied by line length determines the time delay achieved as is characterized in Eq 15. Time delay is a function of not only frequency, but capacitance and inductance values in the delay line network. Therefore, by varying the intensity of the incident illumination, the inductance of selected portions of the line can be varied. The implication of this is that on one SORD chip there is available a variety of effective time delays according to the illumination intensity employed. There also exists the capability of fine tuning the effective time delay of a single delay line structure by varying the level of input illumination used.

In arranging a SORD, a consideration to be addressed is the incurred losses that can be accepted. By baselining this loss factor the effective line width in the SORD architecture can be defined. Shorter line lengths, on or off chip amplification, and signal conditioning prior to rerouting through another or the same delay line may also be used to achieve the necessary time delay with lower losses.

Linear frequency modulated filters (LFM) or "chirp" filters are commonly utilized as the transversal filters for a matched filter application. In niobium based low temperature superconducting material embodiments of such filters, bandwidths of 2.6 GHz centered at 4 GHz have been demonstrated with a dispersion time of 40 ns for non-optically configured LFM arrangements, see reference 12. Chirp filters are commonly used as transversal filters in high performance radar, in spread spectrum communications, and in spectral analysis systems. The transversal filter provides signal delays with tapped delay points and summation of the tapped signals, with appropriate weighting functions. Conventional delay lines offer a wide bandwidth that is measurable in tens of GHz but offer only a few nanoseconds of delay per meter. Using a superconductive microstrip line significantly reduces the amount of line length needed for a suitable delay.

The microstrip structure can incorporate a variety of different architecture, four of which are shown in FIGS. 16, 17, 18 and 19. The arrangement employs a single wide delay line structure in which are located two transmission line elements as are represented by the upper and lower dark stripes.

Figure 16:
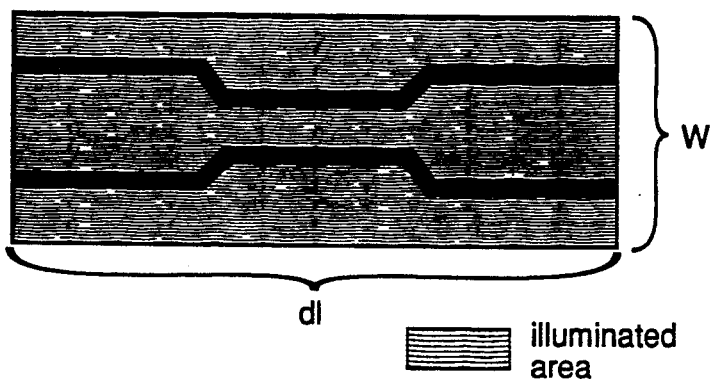
FIG. 16 shows a single width microstrip chirp filter.

In FIG. 16 the darkly shaded area, when illuminated as a reflective mask, outlines the usable chirp backward coupling regions which are in fact the center and most closely spaced portions of the two conductors of the lines. Control over the amplitude response is accomplished in FIG. 16 by the line spacing. The line spacing is, however, bounded by the line width and coupling factors involved. For instance, using a 30 micron line, the effective line width can be as small as 5 microns to reduce the dielectric losses involved.

The coupling mechanism between the two lines in FIG. 16 is determined by the previously defined capacitances. The benefit of this type of architecture is that the coupling is bound in a very small region, therefore there will be a highly efficient power transfer to the backward wave. The amount of area needed to implement the FIG. 16 type of device will be much less than that using a multiple line network. Disadvantages of this type of architecture are caused by the limited space available; there will also be excess signal generated in the backward coupled line. The forward coupled signal which is intended to be minimized may in fact be quite large. Coupling the input signal into the line and extracting the output signal will therefore be of some difficulty. The maximum range of the weighting function will also be hindered by the available line width.

Figure 17:
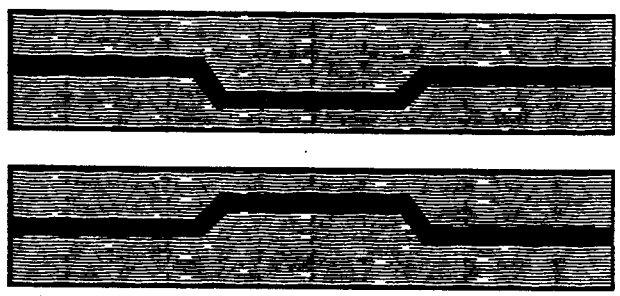
FIG. 17 shows a minimally spaced two-line microstrip chirp filter.

Another embodiment of the chirp filter network is shown in FIG. 17. This architecture also uses a two line structure where the lines are formed by separate masks with minimum line spacing between the two lines. If two micron line widths are used, the line spacing can be varied between the backward couplers by masking off more of one or both lines. The benefits of this type of structure include a reduction in the forwarded coupled signal and ultimately an increase in the overall signal-to-noise ratio. This architecture allows more of the line to be used for the transmission line. Therefore a much thinner line may be used and the dielectric losses reduced.

Figure 18:
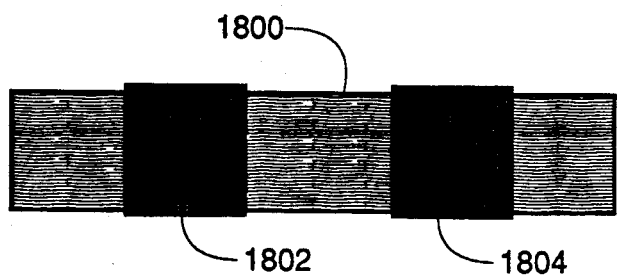
FIG. 18 shows a single thin line arrangement of a chirp filter.

Two other embodiments of the chirp filter use thinner line widths. The first of these, as shown in FIG. 18, is a single line structure utilizing different illumination intensities in order to change the impedance function for a given line length. In FIG. 18, the input port is on the left and the output port on the right and the line section 1800 dispersed between the illuminated sections 1802 and 1804 comprises a resonant section or resonant cavity. Decreasing the area of illumination in the FIG. 18 structure changes the resonant cavity size and hence its resonant frequency. The change in impedance effectively sets up a series of cavity resonators located at unilluminated sections which selectively delay particular frequencies. This arrangement allows the use of much thinner lines and effectively shortens the overall line lengths and thereby reduces dielectric losses. Precise masking of the lines is essential to the desired operation since line dimensions define the tuned cavity characteristics. The use of resonant structures in the FIG. 18 arrangement also brings energy storage effects into consideration with respect to signal degradation since high Q cavities could, in the FIG. 18 arrangement, cause the device to "ring" and thereby degrade the effective signal-to-noise ratio.

Figure 19:
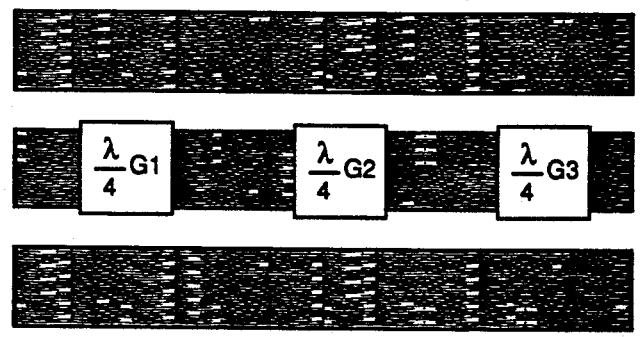
FIG. 19 shows a three conductor tuned cavity of a chirp filter.

The FIG. 19 final embodiment of the chirp filter uses the tuned cavity concept but utilizes three conductors, instead of one for obtaining the chirp response. This arrangement allows a gradual adjustment of cavity Q, accomplished, for example, by using a varying intensity of illumination to change the resonant coupler dimension, to thereby reduce the ringing effects previously encountered. The line widths in the FIG. 19 arrangement can once again be reduced in order to minimize dielectric losses, and the line spacing serves to reduce forward coupling and increase the signal-to-noise ratio of the line. The FIG. 19 arrangement reduces the propagated signal due to the multiple coupling mechanisms involved at G1, G2, and G3.

The chirp filters define the minimum line length needed for a multiple filter device, since the time delay involved in these filters should be on the order of 35 ns of time and most line lengths exceed this time duration. Once the minimum line length is defined, the number of additional devices in other lines of the chip is also defined because of the overall device length left over.

The determining consideration or system drivers in the case of chirp filters include the minimum time delay necessary, the weighting function needed (e.g. Hamming type weighting), and the acceptable losses. The square root of the time-bandwidth (TB) product or compression ratio defines the minimum number of phase subintervals in these filters. The maximum time bandwidth product achievable is dependent upon several factors, the most important of which is the isotropy characteristic of the dielectric material. Anistropy of dielectric material with frequency introduces dispersion on the delay line. This dispersion will be the limiting factor with respect to the maximum achievable TB.

Since the disclosed delay line components are used as a backward wave type coupler, there is inherent concern also with the forward coupled signal. The forward coupled signal should be zero, but when the employed substrate is not isotropic this is not achieved. Also in the coupled microstrip configuration, the field structure is composed of even and odd modes wherein the resulting effective dielectric constants differ and the even and odd mode phase velocities also differ. These characteristics result in a dispersive type of line architecture wherein the dispersion is directly proportional to the insertion loss of the lines and is hence a limitation on the maximum achieved TB. As a baseline the maximum theoretical TB product to be expected is in fact about 1000; for the presently disclosed line purposes however, the TB product will be under 100, so the effects of dispersion are minimized.

As the number of taps increases, a better approximation to the ideal matched filter response is achieved. If it is assumed that the TB is about 100, the minimum number of taps will be 10. The coupled region length is defined by the mean value for the even and odd coupling wavelengths where the even and odd mode wavelength are a simple function of frequency and phase velocity. Once the even and odd coupling wavelengths are found, it is known that these are a simple function of characteristic impedance. This in turn defines the device's line width and spacing. Once the wavelength is found, the coupler length is a simple function of an odd number of wavelengths.

This methodology for coupler realization is used in the arranging of the chirp filter. Once the TB product and the number of taps are known, it is the function of the pulse compression chirp filter to create a phase modulation of the linear FM signal. Such phase modulation $\theta(t)$ is described by:

$$\theta(t) = \omega_o t + \tfrac{1}{2}(\omega_o t^2) \tag{31}$$

where
$\omega_o$ is resonant frequency, and
t is time.

Therefore the total change in phase over the compression filter is defined as;

$$\theta(T) = \omega_o T + \tfrac{1}{2}(\omega_o T^2) \tag{32}$$

Where T is period.
For n number of taps, the phase spacing $\theta sp$ is then;

$$\theta sp = \theta(T)/n \tag{33}$$

From the phase spacing the cumulative midpoint $\theta m$ of each phase interval is given by;

$$\theta m = \theta sp \, (2m-1)/2 \tag{34}$$

Then the group delay to each phase point $t_m$ and the subsequent midpoint frequency $f_m$ are given by;

$$t_m = -\omega_o/\mu + [(\omega_o/\mu)^2 + (2\theta_m/\mu)]^{\tfrac{1}{2}} \tag{35}$$

$$f_m = f_o + \mu t_m/2 \tag{36}$$

where
$\mu$ is permeability and
$f_o$ is resonant frequency.

Figure 20:
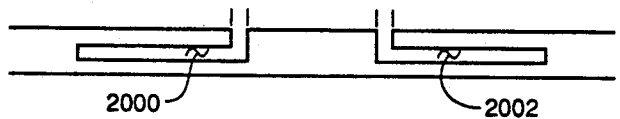
FIG. 20 shows a first arrangement of a spur line notch filter.
Figure 21:
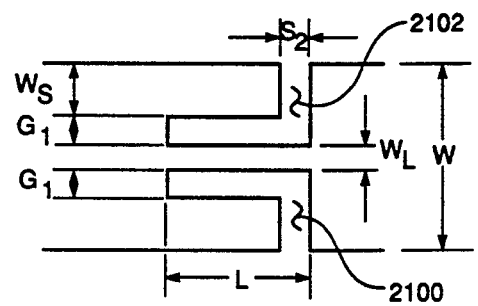
FIG. 21 shows a second spur line notch filter.
Figure 22:
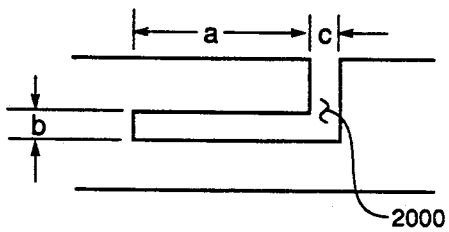
FIG. 22 shows a third spur line notch filter.

A band stop or notch filter is theoretically usable up to frequencies of 40 GHz. These types of filters are termed spur-line filters. The spur-line arrangement is useful because its power radiation capabilities are significantly less than conventional coupled line and stub type notch filters. Three types of spur-line filters are shown in FIGS. 20, 21, and 22 of the drawings. The regions 2000, 2002; 2100, 2102 and 2200 are illuminated and thereby non superconducting in these structures.

This type of filter also utilizes input to output signal coupling in its implementation. Therefore many of the characterizing equations for the chirp compression filter also hold true for this architecture. Coupling is achieved across a normal conducting gap in these filters, therefore the coupling mechanism is defined by the previously described odd mode. If it is assumed that the differences between even and odd mode phase velocities are small, (i.e. small TB), the spur-line filter can be represented by an open circuit transmission line stub shunting an equal length of characteristic impedance z. The even and odd mode characteristic impedances are defined above. The geometric parameters are defined as:

$$Z_{12} = (Z_{oo} + Z_{oe})/2 \tag{37}$$

$$Z_1 = (Z_{oe}/Z_{oo})(Z_{oo} + Z_{oe})/2 \tag{38}$$

Figure 24:
FIG. 24 shows a cascade resonant circuit edge coupled bandpass filter.
Figure 23:
FIG. 23 shows a fourth spur line notch filter.

The bandpass filter configuration to be used is a cascade of resonant circuits. Since the application of bandpass filters differs markedly from that of chip filters, the high Q requirements encountered in chip filters are not so important as determining factors or system drivers when using bandpass filters. There are two basic methodologies to accomplish planar coupling in order to achieve bandpass characteristics i.e., edge coupling and end coupling. These types are represented in FIGS. 23 and 24 where the darkest shading drawing areas are illuminated and non superconducting. The end coupling technique experiences inefficiency of energy transfer across the gap but is however, inherently easier to mask than the edge type. The edge coupling technique requires more real estate area on the host chip but its energy transfer mechanism allows more efficient operation over the end coupling region technique, it is therefore used herein. The length of the edge coupling region is the standard quarter wavelength and the resonant cavity size is on the order of a half wavelength. Both of these sizes can be an integral multiple of the fractional wavelength to ease the overall fabrication tolerances. Synthesis of the bandpass filters closely follows that of the previously defined couplers and the methodology is as follows.

First the even and odd mode characteristic impedances are determined. These characteristic impedances are used to define the line widths spacings, and dielectric thicknesses. The resonator lengths are then calculated. The number of resonators needed is found by the Tchebycheff prototype in view of the system specification of passband, ripple, insertion loss, bandwidth and center frequency, etc.

Figure 26:
FIG. 26 shows a surface resistivity RC network low pass filter.
Figure 25:
FIG. 25 shows a low pass filter.

The following low pass filter can be used up to a maximum of several GHz. The filter geometry is shown in FIGS. 25 and 26 of the drawings where the darkened regions are again illuminated. This filter arrangement uses alternating sections of low impedance and high capacitance. The lengths of these sections are tuned to meet the filter specifications. Once the filter parameters of cutoff frequencies, insertion losses in stop band, and source and load impedance have been defined, the other filter characteristics can be determined. A simple component by component trace is then needed to implement the filter. The initial length values are defined by the equations:

$$l_L = (\lambda_{gc}/2\pi) \sin^{-1}(\omega_L/Z_{oL}) \tag{39}$$

$$l_C = (\lambda_{gc}/2\pi) \sin^{-1}(\omega_c Z_{oc}) \tag{40}$$

Where the subscripts L and C refer to inductive and capacitive portions respectively.

Once initial values for the inductive lines are defined, the end and step discontinuity capacitances are determined and used as correction factors. The capacitive lengths must be defined from these end and step discontinuities and the inductances of the T sections used as correction factors to the capacitive lengths. This sequence is then iterated to define final values.

It is also possible to operate within the transition region of the superconductor to obtain the required impedances. By varying the illumination intensity, the effective surface resistance and inductance values may be increased. A low pass structure which employs this technique appears similar to the single line resonant cavity chirp filter and the end coupled bandpass filter. The alternate method of FIG. 26 is a simple RC network, which can use surface resistivity properties to form a low pass filter. By optically illuminating a portion of the line, an increase in resistance occurs and this forms the resistive portion of the filter.

The realization of high pass filters is essentially identical to that of low pass networks, as is described above. The concept of duality is then incorporated in the transformation of a low pass network into a high pass network.

To further demonstrate the SORD concept, a low pass filter is described. To illustrate implementation of the duality concept, a transformation of the selected low pass filter into a high pass filter is also disclosed. The filter selected is a 3 element, 0.01 db ripple Tschebycheff low pass network. The general Tschebycheff low pass characteristic curves are shown in FIGS. 27 and 28 of the drawings.

The FIGS. 27 and 28 curves are normalized with the parameters shown therein being defined as:

| PARAMETER | DEFINITION |
|---|---|
| $L_\lambda$ | Attenuation in db |
| $\omega'$ | Normalized angular frequency |
| $\omega_1'$ | 3-db band edge angular frequency |

For example, the normalization element values are;
$C_1 = 0.6291$
$L_2' = 0.9702$
$C_3' = 0.6291$ Upon conversion to implement a 2 GHz cutoff frequency filter with source and load impedances of 50 ohms, the final filter network is as shown in FIG. 29.

From this network the concepts outlined in the low pass section may be used to achieve the final circuit configuration shown in FIG. 30. The associated lengths for particular elements and the SORD masking scheme are shown in FIG. 31.

Figure 32:
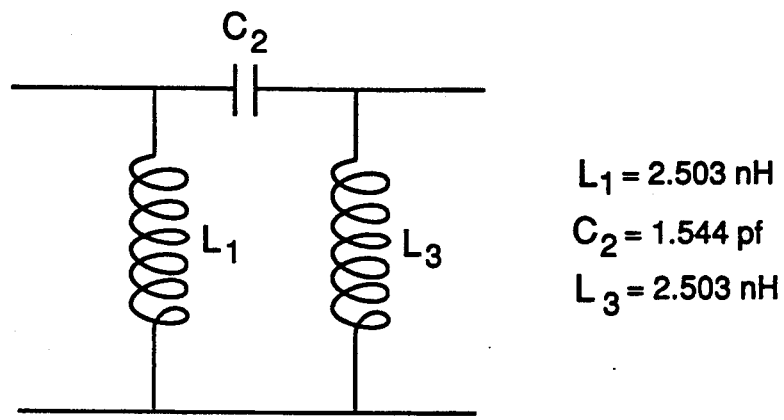
FIG. 32 shows the electrical schematic for a 2 Gigahertz cuttoff high pass filter.
Figure 33:
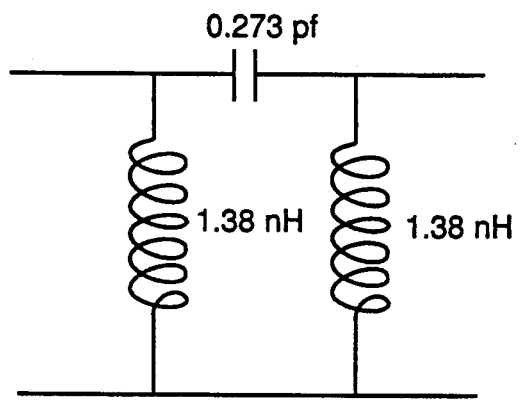
FIG. 33 shows the electrical schematic for a modified 2 Gigahertz cutoff high pass filter.
Figure 34:
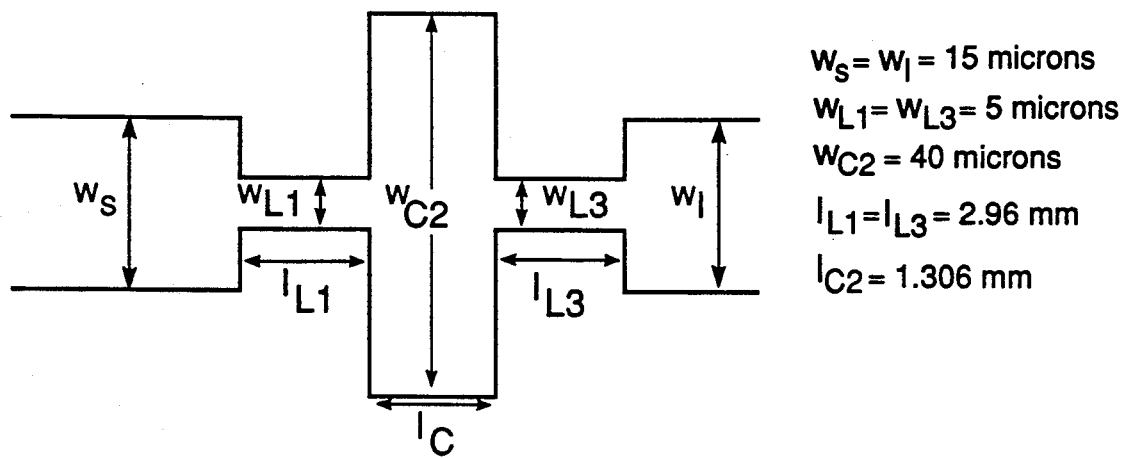
FIG. 34 shows the FIG. 33 filter with transmission line dimensions.

High pass filter network synthesis follows essentially the same methodology as the low pass example. By using the concept of duality, the normalized element values are found to be;
$L_1' = 0.6291$ nH
$C_2' = 0.9702$ pf
$L_3' = 0.6291$ nH Upon conversion to implement a 2 GHz cutoff frequency with source and load impedances of 50 ohms, the filter network is as shown in FIG. 32; from this configuration the concepts outlined in the low pass section may be used again to account for end capacitances and T section inductances. The relative size of the step capacitances compared to the lumped element capacitive sections are very small, therefore they are neglected for both the low and high pass networks. The final circuit configuration is shown in FIG. 33. The associated lengths of the particular elements and the SORD masking scheme are shown in FIG. 34.

The chirp filter may ultimately determine the minimum line length necessary for a universal filter arrangement. If it is assumed that about a 1.5 meter line length is necessary to implement the chirp filter, it follows that the SORD has the capability of implementing many different high and low pass filters. Another feature of the SORD is that the final device architecture and the functional definition are defined in a single step, i.e., the masking. By defining the final device/function by these means, the fabrication process becomes user specific. The user can define the necessary requirements and have a chip tailored to suit the particular system specific needs. By this device architecture definition the SORD is suited to large fabrication volume applications.

Novel features of the SORD therefore include the use of optical illumination to produce quasiparticles and thereby define device architectures; the ease of reconfigurability to produce many different devices/functions from a single SORD chip is also a desirable feature. The SORD concept is applicable to both low and high temperature superconductive regimes.

The SORD can reduce need for the individual filter network elements or chips usually needed to realize different filtering and signal delay functions. The SORD also has the capability to implement different signal processing functions normally composed of many elements, such functions as signal delays, correlations, convolutions, and mathematical operations and adds the capability of array configuring to implement different signal processing functions.

While the apparatus and method herein described constitute a referred embodiment of the invention, it is to be understood that the invention is not limited to this precise form of apparatus or method and that changes may be made therein without departing from the scope of the invention which is defined in the appended claims.

REFERENCES (Each incorporated by reference herein)

1. I. Bozovic, D. Kirilov, A. Kapitulnik, K. Char, M. R. Hahn, M. R. Beasley, T. H. Geballe, Y. H. Kim, and A. H. Heeger, Phys. Rev. Lett. 59 (2219), 1987.
2. W. R. Donaldson, A. M. Kadin, P. H. Ballentine, and R. Sobolewski, Appl. Phys. Lett., 54 (24), 12 Jun. 1989.
3. H. S. Kwok, J. P. Zheng, and Q. Y. Ying, Appl. Phys. Lett. 54 (24), 12 Jun. 1989.
4. P. B. Corkum, F. Brunel, N. K. Sherman, and T. Srinivasan-Rao, Phys. Rev. Lett. 61 (2886), 1988.
5. S. D. Brorson, J. G. Fujimoto, and E. P. Ippen, Phys. Rev. Lett. 59 (1962), 1987.
6. H. S. Carslaw, and J. C. Geager, *Conduction of Heat in Solids* (Clarendon, Oxford), 1986.
7. A. Frenkel, M. A. Saifi, T. Venkatesan, C. Lin, X. D. Wu, and A. Inam, Appl. Phys. Lett. 54 (16), 17 Apr. 1989.
8. T. C. Edwards, *Foundation of Microstrip Design* (John Wiley and Sons), 1981.
9. T. Van Duzer, and C. W. Turner, *Principles of Superconductive Devices and Circuits* (Elsevier), 1981.
10. W. H. Chang, J. Appl. Phys. 50 (12), Dec. 1979.
11. S. M. Anlage, et al, Appl. Phys. Lett. 54 (26) 26 Jun. 1989.
12. R. S. Withers, A. C. Andersen, P. V. Wright, and S. A. Reible, IEEE Trans. Mag. Mag-19 No. 3, (480-484), May 1983.
13. C. E. Cook, and M. Bernfeld, *Radar Signals* (Academic Press), 1967.
14. R. N. Bates, and R. E. Pearson, Electronic Engineering (39-41), Apr. 1978.
15. G. L. Matthaei, L. Young, E. M. T. Jones, *Microwave Filters, Impedance-Matching Networks, and Coupling Structures* (McGraw-Hill), 1964.

I claim:

1. Optical energy alterable transmission line apparatus comprising the combination of:
   a planar disposed layer of superconductive material extending between transmission line electrical input and electrical output nodes disposed thereon;
   means for maintaining selected contiguous pattern portions of said planar layer material located intermediate said input and output nodes within the superconducting range of operating temperature thereof;

optical energy source means for reversibly elevating predetermined contiguous pattern complementing portions of said superconductive material, located adjacent and intermediate said contiguous pattern portions, above said superconductive range of operating temperature and generating thereby operating regions of lessened electrical conductivity segregating and electrically isolating said superconductive contiguous pattern portions from each other;

said selected contiguous pattern of superconducting portions of said material comprising a multiple series and shunt arm inclusive conductive electrical path of predetermined electrical inductive, capacitance, and resistance determined transmission line electrical characteristics between said electrical input and electrical output nodes; and said non superconducting predetermined pattern of elevated temperature complementary portions of said superconductive material comprising electrical insulation regions disposed adjacent and intermediate said selected contiguous pattern portions.

2. The optical energy alterable transmission line apparatus of claim 1 wherein said optical energy source means includes masking means for defining said contiguous pattern and predetermined pattern complementary portions of said superconductive layer material.

3. The optical energy alterable transmission line apparatus of claim 2 wherein said masking means includes means for electively changing the physical configuration of said contiguous pattern and predetermined contiguous pattern complementing portions of said material.

4. The optical energy alterable transmission line apparatus of claim 1 wherein said superconductive material is of type II superconducting characteristics.

5. The optical energy alterable transmission line apparatus of claim 1 wherein said contiguous pattern and predetermined contiguous pattern complementing portions of said superconductive material comprise a microstrip transmission line.

6. The optical energy alterable transmission line apparatus of claim 1 wherein said superconductive material includes one component taken from the group consisting of Yttrium Barium Copper Oxide, Niobium, and Niobium Nitride.

7. The optical energy alterable transmission line apparatus of claim 1 wherein said optical energy source means includes a laser.

8. Optically reconfigurable electrical signal processing apparatus comprising the combination of:
a thin film layer of superconductor material extending between signal input and signal output node regions of said apparatus;
a plurality of electrical impedance elements disposed in said superconductor material and along a path joining said signal input and signal output node regions;
means for maintaining selected portions of said superconductor material in a cold temperature superconducting state of operation;
said electrical impedance elements each including electrical impedance related physically shaped superconducting first pattern portions of said cold temperature superconductor thin film layer material;
optical energy source means including pattern alterable energy blocking mask means for conveying superconductivity spoiling optical heating energy onto physically shaped alterabl second pattern portions of said thin film layer material;
said electrical impedance elements also including optically heated superconductivity spoiled electrically insulating second pattern portions of said thin film layer material.

9. The signal processing apparatus of claim 8 wherein said first pattern cold superconducting portions of said thin film material and said second pattern heated superconductivity spoiled portions thereof are complementary in physical shape and size.

10. The signal processing apparatus of claim 8 wherein said apparatus comprises an electrical transmission line inclusive of electrical inductance and electrical capacitance elements.

11. The signal processing apparatus of claim 8 wherein said apparatus comprises an electrical wave filter inclusive of electrical inductance and electrical capacitance elements.

12. The signal processing apparatus of claim 8 wherein said electrical impedance elements include inductively coupled portions of said cold temperature superconducting state material.

13. The signal processing apparatus of claim 8 wherein said electrical impedance elements include parallel disposed capacitive coupled portions of said cold temperature superconducting state material.

14. The signal processing apparatus of claim 8 wherein said electrical impedance elements include electrical resistors having superconductive material maintained above the temperature of said cold temperature superconducting state.

15. An electrical signal processing network which includes electrical impedance elements having optically determinable superconducting and nonsuperconducting superconductor material segments and comprising the combination of:
a thin film of superconductor material;
means for cooling said thin film of superconductor material to a temperature within its superconducting characteristic range;
means for optically heating predetermined changeable pattern portions of said thin film material to a temperature above said superconducting range;
said predetermined pattern portions of nonsuperconducting material being areas of electrical insulation delineating and defining complimentary shaped electrical impedance network elements of predetermined geometrically configured superconducting thin film material.

* * * * *